US008758510B2

(12) United States Patent
Straubinger et al.

(10) Patent No.: US 8,758,510 B2
(45) Date of Patent: *Jun. 24, 2014

(54) PRODUCTION METHOD FOR AN SIC VOLUME MONOCRYSTAL WITH A NON-HOMOGENEOUS LATTICE PLANE COURSE AND A MONOCRYSTALLINE SIC SUBSTRATE WITH A NON-HOMOGENEOUS LATTICE PLANE COURSE

(75) Inventors: Thomas Straubinger, Möhrendorf (DE); Michael Vogel, Nürnberg (DE); Andreas Wohlfart, Erlangen (DE)

(73) Assignee: SiCrystal Aktiengesellschaft, Nuremberg (DE)

( * ) Notice: Subject to any disclaimer, the term of this patent is extended or adjusted under 35 U.S.C. 154(b) by 69 days.

This patent is subject to a terminal disclaimer.

(21) Appl. No.: 13/338,639

(22) Filed: Dec. 28, 2011

(65) Prior Publication Data
US 2013/0171403 A1 Jul. 4, 2013

(51) Int. Cl.
*C30B 21/02* (2006.01)

(52) U.S. Cl.
USPC ............. 117/105; 117/86; 117/108; 117/109; 117/952

(58) Field of Classification Search
USPC .............................. 117/86, 105, 108, 109, 952
See application file for complete search history.

(56) References Cited

U.S. PATENT DOCUMENTS

| 5,441,011 | A | 8/1995 | Takahaski et al. |
| 5,683,507 | A | 11/1997 | Barrett et al. |
| 5,985,024 | A | 11/1999 | Balakrishna et al. |
| 6,770,136 | B2 | 8/2004 | Kuhn et al. |
| 6,773,505 | B2 * | 8/2004 | Kuhn et al. ...................... 117/89 |
| 2004/0099205 | A1 * | 5/2004 | Li et al. ............................. 117/2 |
| 2006/0144324 | A1 | 7/2006 | Sakaguchi et al. |
| 2007/0072324 | A1 * | 3/2007 | Krames et al. .................. 438/46 |
| 2007/0240630 | A1 | 10/2007 | Leonard et al. |

FOREIGN PATENT DOCUMENTS

| DE | 19931332 C2 | 6/2002 |
| EP | 1200650 B1 | 4/2003 |

* cited by examiner

*Primary Examiner* — Bob M Kunemund
(74) *Attorney, Agent, or Firm* — Laurence A. Greenberg; Werner H. Stemer; Ralph E. Locher

(57) ABSTRACT

A method is used for producing an SiC volume monocrystal by sublimation growth. During growth, by sublimation of a powdery SiC source material and by transport of the sublimated gaseous components into the crystal growth region, an SiC growth gas phase is produced there. The SiC volume monocrystal grows by deposition from the SiC growth gas phase on the SiC seed crystal. The SiC seed crystal is bent during a heating phase before such that an SiC crystal structure with a non-homogeneous course of lattice planes is adjusted, the lattice planes at each point have an angle of inclination relative to the direction of the center longitudinal axis and peripheral angles of inclination at a radial edge of the SiC seed crystal differ in terms of amount by at least 0.05° and at most by 0.2° from a central angle of inclination at the site of the center longitudinal axis.

12 Claims, 3 Drawing Sheets

US 8,758,510 B2

PRODUCTION METHOD FOR AN SIC VOLUME MONOCRYSTAL WITH A NON-HOMOGENEOUS LATTICE PLANE COURSE AND A MONOCRYSTALLINE SIC SUBSTRATE WITH A NON-HOMOGENEOUS LATTICE PLANE COURSE

BACKGROUND OF THE INVENTION

1. Field of the Invention

The invention relates to a method for producing an SiC volume monocrystal and to a monocrystalline SiC substrate.

2. Background of the Invention

The semiconductor material silicon carbide (SiC) is used for high frequency components and for special light-providing semiconductor components because of its excellent physical, chemical, electrical and optical properties, inter alia also as a starting material for power-electronic semiconductor components. SiC substrates (=SiC wafers) with as large a substrate diameter as possible and as high a quality as possible are required for these components.

The basis of the SiC substrates are high-grade SiC volume monocrystals, which are generally produced by physical gas phase deposition, in particular by a sublimation method described, for example, in U.S. Pat. No. 6,773,505 B2 and in German patent DE 199 31 332 C2. The disc-shaped monocrystalline SiC substrates are cut out of these SiC volume monocrystals and are then provided during the manufacture of the components with at least one epitaxy layer in particular also consisting of SiC. The quality of the epitaxy layer decisively depends on the local orientation of the monocrystalline substrate, in other words of the SiC substrate. If local deviations from the optimal orientation occur in the crystal structure of the SiC substrate, this may propagate into the epitaxy layer. The epitaxy layer then also contains local defects, which ultimately can lead to poor properties of the end products, in other words the semiconductor components.

SUMMARY OF THE INVENTION

It is accordingly an object of the invention to provide a production method for an SiC volume monocrystal with a non-homogeneous lattice plane course and a monocrystalline SiC substrate with a non-homogeneous lattice plane course which overcomes the above-mentioned disadvantages of the prior art devices and methods of this general type, which has improved suitability for the component production.

To achieve the object relating to the method, a method is disclosed, in which an SiC seed crystal is arranged before the beginning of growth in a crystal growth region of a growth crucible, which is preferably completely closed, in particular at least during the growth. Powdery SiC source material is introduced into an SiC storage region of the growth crucible. During growth, by sublimation of the powdery SiC source material and by transport of the sublimed gaseous components to the crystal growth region, an SiC growth gas phase is produced there, and the SiC volume monocrystal having a central center longitudinal axis grows by deposition out of the SiC growth gas phase onto the SiC seed crystal. The SiC seed crystal is bent during a heating phase before the beginning of growth in such a way that an SiC crystal structure with a non-homogeneous course of lattice planes is adjusted, wherein the lattice planes at each point have an angle of inclination relative to the direction of the center longitudinal axis in particular also valid for the SiC seed crystal, and peripheral angles of inclination at a radial edge of the SiC seed crystal differ in terms of amount by at least 0.05° and at most 0.2° from a central angle of inclination at the site of the center longitudinal axis. The SiC crystal structure with the non-homogeneous lattice plane course is propagated during the growth of the SiC seed crystal into the growing SiC volume monocrystal.

An SiC volume monocrystal, which has a special deliberately introduced non-homogeneity in its SiC crystal structure, is produced by the method according to the invention. The SiC crystal structure has certain lattice planes, which are determined by the spatial, in particular periodically repeating, arrangement of the atoms and which run, in particular in a non-level manner, preferably bent or curved, in an SiC volume monocrystal produced according to the invention. To this extent, the course of the lattice planes is non-homogeneous. Strictly speaking, with a non-level course, it would be better to refer to "lattice faces" instead of "lattice planes". The mentioned non-level course is to be included here, however, under the term "lattice planes". The lattice planes, at the radial edge of the SiC volume monocrystal, have a different orientation than in the center thereof. Direction details relate here, in each case, to the central center longitudinal axis of the SiC volume monocrystal. A direction parallel to or along the center longitudinal axis is thus designated "axial", a direction perpendicular thereto is designated "radial" and a peripheral direction running round the center longitudinal axis is designated "tangential". The orientation of the lattice planes deviates at the radial edge (=edge orientation) in particular by an amount in the range between 0.05° and 0.2° from the orientation of the lattice planes in the center (=center orientation).

This is based on the following recognition. During the epitaxy coating in the course of producing the components, the SiC substrates are generally heated on a hot underlay to temperatures of above 1000° C. In this case, a relatively large temperature difference is produced between the substrate lower side and the substrate upper side, which is associated with a different expansion of the substrate lower side and the substrate upper side, and as a consequence thereof, with a slight curvature of the SiC substrate.

If an SiC substrate is used for the epitaxy process, which, at room temperature has an (approximately) ideal geometry and a substantially homogeneous, i.e. level, course of the lattice planes of the SiC crystal structure, no ideal epitaxy conditions prevail during the actual epitaxy process because of the described curvature of the SiC substrate.

This is taken into account in the course of the production method according to the invention in that the SiC volume monocrystal is grown with the already mentioned non-homogeneity in the lattice plane course. The deviations deliberately introduced in the lattice plane orientation correspond here, in particular, substantially to the negative or inverse of the deviations, which are adjusted in the curvature of the SiC substrate during the epitaxy process. The deliberately introduced deviations in the lattice plane orientation compensate the lattice plane bending of the SiC substrate during the epitaxy process, at least approximately. Overall, an SiC crystal structure with lattice planes running approximately in a level manner, in particular with lattice planes practically without orientation differences between the edge and the center, are then present during the epitaxy process, if an SiC substrate obtained from an SiC volume monocrystal produced according to the invention is used. An SiC substrate of this type, even with an ideal level disc geometry, has the differences mentioned that are advantageous with regard to the following epitaxy process in the lattice plane orientations.

The decisive step for producing the non-homogeneous lattice plane course in the SiC volume monocrystal takes place in the method according to the invention even before the actual growth. Thus, during the heating phase in the SiC seed crystal, a bend, in particular a curvature is caused, resulting inter alia in the advantageous curvature of the lattice planes in the SiC seed crystal. This lattice plane curvature is then passed on or handed down during the actual growth phase into the growing SiC volume monocrystal.

Overall, SiC volume monocrystals, which allow particularly good results in the epitaxy process carried out to produce the components, can thus be produced by the growth method according to the invention. SiC volume monocrystals produced according to the invention can thus be very efficiently further used, in particular for producing semiconductor components.

A configuration is favorable in which the SiC seed crystal, before the beginning of growth, is rigidly, but in particularly detachably, connected to an, in particular, disc-like seed holder to form a holder-seed unit, and the holder-seed unit is loosely inserted with the downwardly directed growth boundary surface of the SiC seed crystal in the region of an upper crucible end wall of the growth crucible into the growth crucible, wherein an in particular closed cavity located within a wall structure of the growth crucible is formed between a rear side of the seed holder remote from the SiC seed crystal and the upper crucible end wall. An axial holder dimension (=holder thickness) with a value in the range between 0.5 mm and 1.5 mm is moreover provided for the seed holder. Furthermore, a holder material, which has a different, in particular a larger, coefficient of heat expansion than an SiC material of the SiC seed crystal, is used for the seed holder. Thus, the bending of the SiC seed crystal during the heating to the growth temperature and the SiC crystal structure brought about thereby with the non-homogeneous lattice plane orientation can be adjusted in a defined manner to the desired extent. Preferred suitable parameters for this are the holder material and, in particular, its coefficient of heat expansion, the thickness of the seed holder and the cavity provided behind the seed holder. In this case, the cavity provided the space required for a corresponding bending. Because of the different coefficients of heat expansion of the seed holder and the SiC seed crystal, during heating of the growth crucible to temperatures of in particular above 2000° C., the intentional bending of the SiC seed crystal occurs. Thus, graphite, which may, for example, be used as the holder material, expands more than SiC. In this case, the seed holder, on the one hand, should not be too thick, in order to not break the SiC seed crystal. On the other hand, the seed holder should not be too thin, as otherwise no adequate bending of the SiC seed crystal is ensured. The thickness range between 0.5 mm and 1.5 mm is particularly well suited in this regard. It meets both requirements. Moreover, the rigid connection provided in the framework of the holder-seed unit between the SiC seed crystal and the seed holder is favorable, as this prevents hollow channels growing from the rear side of the SiC seed crystal along the axial temperature gradient prevailing in the growth crucible into the SiC seed crystal, whereby the quality of the growing SiC volume monocrystal could otherwise also be reduced. The seed holder rigidly attached on the rear side of the SiC seed crystal to this extent is used as a barrier with respect to the cavity, from where the hollow channels could grow into the SiC seed crystal without this barrier function.

A holder diameter is preferably provided for the seed holder, which, in particular, is greater than a seed diameter of the SiC seed crystal preferably placed concentrically with respect to the center longitudinal axis on the seed holder and which, at least in the region of the upper crucible end wall of the growth crucible, in which the holder-seed unit is inserted, is in particular greater than a growth region diameter of the crystal growth region provided there. Dimensions perpendicular to the center longitudinal axis, in other words in the radial direction, are designated diameters here, in each case. The holder-seed unit can then be particularly easily loosely inserted with the edge region of the seed holder projecting laterally over the SiC seed crystal, for example into a side crucible wall recess, so that, on the one hand, the desired holding function and, on the other hand, the possibility for bending is provided.

According to a further favorable configuration, an in particular substantially uniform, axial cavity dimension with a value in the range between 100 µm and 400 µm is provided for the cavity. The axial cavity dimension is the extension, in this case, in the direction of the center longitudinal axis. This is, in particular, therefore the cavity length or depth. A cavity with this axial extent provides sufficient space for the bending of the holder-seed unit. The axial cavity dimension determines, in particular, the maximum possible bending of the holder-seed unit and therefore of the SiC seed crystal during the heating phase. Bending is namely, in particular, only possible until the holder-seed unit strikes against the upper crucible end wall limiting the cavity. This maximum possible bending should preferably only be so great that it can be compensated again during the epitaxy process. In this regard, the value of 400 µm given as the upper limit for the axial cavity dimension is very suitable.

According to a further favorable configuration, an axial seed dimension with a value in the range between 0.5 mm and 1.0 mm is provided for the SiC seed crystal. The axial seed dimension is, in this case, in particular, the seed thickness. Preferably, an axial holder dimension (=holder thickness) with a value, which is at most twice as large as an axial seed dimension (=seed thickness) of the SiC seed crystal, is provided for the seed holder. An axial holder dimension with a value in the range between 0.9 mm and 1.1 mm is preferably provided for the seed holder and an axial seed dimension with a value in the range between 0.65 mm and 0.75 mm is provided for the SiC seed crystal. The bending of the SiC seed crystal also depends on the ratio of the thicknesses of the SiC seed crystal and seed holder. Thus, a very thick SiC seed crystal cannot be bent by a very thin seed holder. On the other hand, a thin SiC seed crystal can be easily bent, in some circumstances, however, also too strongly bent. Consequently, the desired bending of the SiC seed crystal during the heating phase can in particular also be adjusted by a suitable seed thickness and/or by a suitable ratio of holder thickness to seed thickness. The SiC seed crystal should also therefore not be too thin, as in the starting phase of the growth, an etching back of the SiC seed crystal firstly takes place. A very thin SiC seed crystal could, for example, completely disintegrate in the radial outer regions, so no crystalline information can be passed there to the growing SiC volume monocrystal. The above-mentioned dimensioning specifications with regard to the seed thickness and/or with regard to the holder thickness lead to advantageous configurations, which, in each case, meet the requirements mentioned and are therefore particularly well suited in this regard.

According to a further advantageous configuration, a radial extent into a region between a side (tangential) limiting face of the seed holder and a (tangential) crucible side wall is provided for the cavity. The cavity expands laterally, in other words in the radial direction, further than the seed holder. The cavity has a larger diameter than the seed holder. As a result, no lateral forces originating from the crucible side wall, which could otherwise cause an undesired or undefined bending, act on the seed holder at its side peripheral edge.

According to a further favorable configuration, a growth region diameter, which is greater, in particular greater by 20 mm than a seed diameter of the SiC seed crystal, is provided for the crystal growth region, in particular in a region, in which the SiC seed crystal is located. A further cavity, which is preferably open toward the crystal growth region, is formed, in particular, between a side limiting face (=peripheral edge) of the SiC seed crystal and the tangentially running inner face of the crucible side wall. It may, however, also be closed. The further cavity is, in particular, a free gap running tangentially around the SiC seed crystal. As a result, no lateral forces originating from the crucible side wall, which could otherwise cause an undesired or undefined bending, act on the SiC seed crystal on its side peripheral edge. Moreover, an exact fitting of the SiC seed crystal in the inner region of the crucible laterally surrounded by the crucible side wall is only possible with a substantial outlay. If the attempt at exact fitting were to fail and only a very thin gap were to remain between the crucible side wall and the side peripheral edge of the SiC seed crystal, this very thin gap would have an unfavorable effect on the local thermal field at this point. Therefore, it is more advantageous to provide from the start a further cavity running tangentially around the SiC seed crystal with a larger cavity or gap width, which is then, in particular, defined, for example in the region between about 2 mm and about 6 mm.

According to a further favorable configuration, a holder material with a value of a coefficient of heat expansion in the range between $4 \cdot 10^{-6}$ $K^{-1}$ and $6 \cdot 10^{-6}$ $K^{-1}$, in particular of about $5 \cdot 10^{-6}$ $K^{-1}$, is used for the seed holder. For example, the holder material may be a graphite material. The bending of the SiC seed crystal during the heating phase also depends on the difference in the coefficient of heat expansion of the SiC seed crystal and of the seed holder. SiC has a coefficient of heat expansion of about $3 \cdot 10^{-6}$ $K^{-1}$. In graphite materials, the coefficient of heat expansion, depending on the type of material, may be between about $3 \cdot 10^{-6}$ $K^{-1}$ and about $6 \cdot 10^{-6}$ $K^{-1}$. Such graphite materials are preferably used here, the coefficient of heat expansion of which is at least about $4 \cdot 10^{-6}$ $K^{-1}$. The bending of the SiC seed crystal when being heated to growth temperature can thus be very well adjusted to the desired amount.

To achieve the object relating to the monocrystalline SiC substrate, an SiC substrate is disclosed with a substrate main surface, with a central center longitudinal axis oriented perpendicular to the substrate main surface, with a radial edge, which, in particular, runs concentrically with respect to the central center longitudinal axis, and with an SiC crystal structure having lattice planes, wherein the lattice planes at each point have an angle of inclination relative to the direction of the center longitudinal axis, and peripheral angles of inclination at any desired point at the radial edge differ in terms of amount by at least 0.05° and at most 0.2°, from a central angle of inclination at the site of the central center longitudinal axis.

The SiC substrate according to the invention has a deliberately introduced bending of the lattice planes. This non-homogeneous lattice plane course is precisely configured in such a way that it compensates the further bending of the lattice planes associated with the mechanical substrate bending during an epitaxy process. During the epitaxy process, an SiC crystal structure with a substantially homogeneous, i.e. level, lattice plane course is therefore present. The SiC substrate according to the invention is accordingly excellently suited to the efficient production of high-grade components with a low reject rate. In comparison, in the component production using previous SiC substrates, a lower yield and/or higher rejects result because of the non-ideal epitaxy conditions with at least local deviations from a uniform lattice plane orientation. To this extent, the SiC substrate according to the invention can be used with particular advantage, in particular as a substrate for producing semiconductor components.

Monocrystalline SiC substrates with bending of the lattice planes introduced deliberately did not previously exist. They can be produced for the first time from SiC volume monocrystals, which have been produced by the method according to the invention described above or the configurations thereof, for example by the successive and disc-wise cutting off or sawing off of SiC volume monocrystals of this type. The substrate main surface of an SiC substrate of this type is, in this case, in particular oriented substantially perpendicular to the growth direction of the SiC volume monocrystal. The growth direction is parallel to the center longitudinal axis.

The SiC substrate according to the invention satisfies the industrial requirements with regard to use for production of semiconductor components. A substrate thickness measured perpendicular to the substrate main surface of an SiC substrate of this type is, in particular in the range between about 100 μm and about 1000 μm and preferably in the range between about 250 μm and about 700 μm, the substrate thickness having a global thickness fluctuation viewed over the complete substrate main surface of preferably at most 20 μm. Furthermore, at least one of the two mutually opposing substrate main surfaces has a surface roughness of preferably at most 3 nm. The SiC substrate has a certain mechanical stability and is, in particular, self-supporting. It preferably has a substantially round disc shape, i.e. the substrate main surface is practically round. A slight deviation from the precisely circular geometry may optionally be present because of at least one identification marking provided on the peripheral edge.

A configuration is favorable, in which the substrate main surface has a diameter of about 100 mm, and the difference between the peripheral angles of inclination and the central angle of inclination in terms of amount is in the range between 0.05° and 0.15°, and an axial dimension in the direction of the center longitudinal axis is preferably in the range between 250 μm and 500 μm. The axial dimension in the direction of the center longitudinal axis is, in particular, the substrate thickness. According to a further favorable configuration, the substrate main surface has a diameter of about 150 mm, and the difference between the peripheral angles of inclination and the central angle of inclination in terms of amount is in the range between 0.075° and 0.175°, and an axial dimension in the direction of the center longitudinal axis is preferably in the range between 300 μm and 600 μm. According to a further favorable configuration, the substrate main surface has a diameter of about 200 mm, and the difference between the peripheral angles of inclination and the central angle of inclination in terms of amount is in the range between 0.1° and 0.2° and an axial dimension in the direction of the center longitudinal axis is preferably in the range between 350 μm and 700 μm. These particularly favorable configurations are distinguished in each case in that the SiC substrates, depending on their respective geometric dimensioning, in particular depending on their respective substrate diameter, then have a particularly advantageous lattice plane faulty orientation, in order to at least slightly compensate the lattice plane bendings occurring during the epitaxy process.

Other features which are considered as characteristic for the invention are set forth in the appended claims.

Although the invention is illustrated and described herein as embodied in a production method for an SiC volume monocrystal with a non-homogeneous lattice plane course and a monocrystalline SiC substrate with a non-homogeneous lattice plane course, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
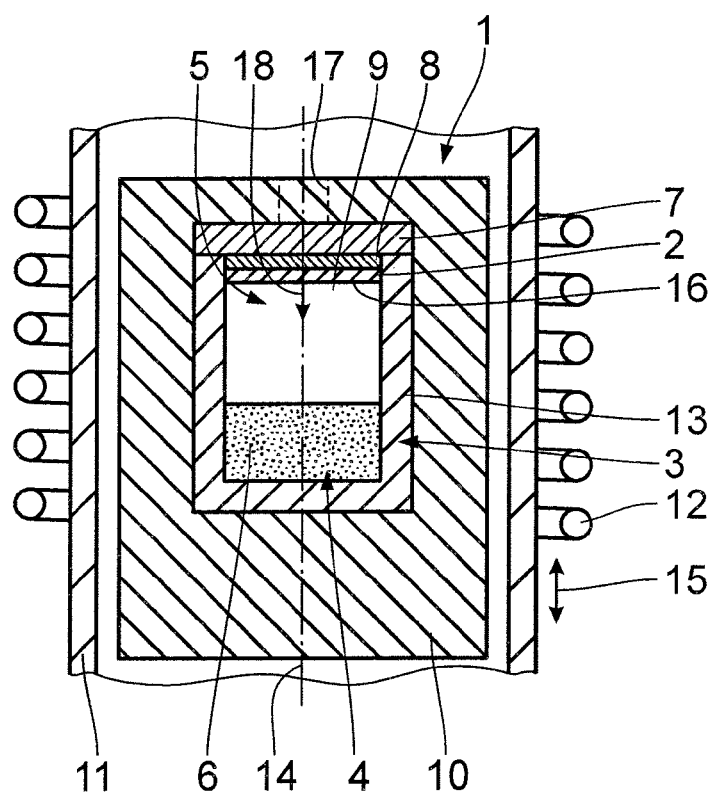
FIG. 1 is a diagrammatic sectional view of an embodiment of a growth arrangement during sublimation growth of an SiC volume monocrystal according to the invention.

Mutually corresponding parts are provided with the same reference numerals in FIGS. 1 to 5. Details of the embodiments described in more detail below can also be an invention per se or be part of an inventive subject Referring now to the figures of the drawing in detail and first, particularly, to FIG. 1 thereof, there is shown an embodiment of a growth arrangement 1 for producing an SiC volume monocrystal 2 by sublimation growth. The growth arrangement 1 contains a growth crucible 3, which contains an SiC storage region 4 and a crystal growth region 5. Located in the SiC storage region 4 is, for example, powdery SiC source material 6, which is introduced as a prefabricated starting material before the beginning of the growth process into the SiC storage region 4 of the growth crucible 3.

An SiC seed crystal 8 extending axially into the crystal growth region 5 is provided in the region of a crucible end wall 7 of the growth crucible 3 opposing the SiC storage region 4. The SiC seed crystal 8 is, in particular, monocrystalline. Its arrangement within the growth crucible 3 will be described in more detail below with the aid of FIGS. 2 and 3. The crucible end wall 7 is configured as a crucible lid of the growth crucible 3 in the embodiment shown. This is not imperative, however. The SiC volume monocrystal 2 to be grown grows on the SiC seed crystal 8 by deposition from an SiC growth gas phase 9 forming in the crystal growth region 5. The growing SiC volume monocrystal 2 and the SiC seed crystal 8 have approximately the same diameter. If at all, there is a deviation of at most 10%, by which a seed diameter of the SiC seed crystal 8 is smaller than a monocrystal diameter of the SiC volume monocrystal 2. However, a gap, not shown in FIG. 1, may be present between the inside of a crucible side wall 13, on the one hand, and the growing SiC volume monocrystal 2 and the SiC seed crystal 8, on the other hand.

The growth crucible 3 including the crucible lid 7, in the embodiment according to FIG. 1, consists of an electrically and thermal conductive graphite crucible material with a density of, for example, at least 1.75 g/cm3. Arranged around it is a thermal insulation layer 10. The latter consists, for example, of a foam-like graphite insulation material, the porosity of which is, in particular, significantly higher than that of the graphite crucible material.

The thermally insulated growth crucible 3 is placed inside a tubular container 11, which is designed as a quartz glass tube in the embodiment and forms an autoclave or reactor. To heat the growth crucible 3, an inductive heating device in the form of a heating coil 12 is arranged around the container 11. The growth crucible 3 is heated by the heating coil 12 to growth temperatures of more than 2000° C., in particular to about 2200° C. The heating coil 12 inductively couples an electric current into the electrically conductive crucible side wall 13 of the growth crucible 3. This electric current substantially flows as a circulating current in the peripheral direction within the circular and hollow cylindrical crucible side wall 13 and in the process heats the growth crucible 3. If necessary, the relative position between the heating coil 12 and the growth crucible 3 can be changed axially, i.e. in the direction of a center longitudinal axis 14 of the growing SiC volume monocrystal 2, in particular in order to adjust the temperature or the temperature course within the growth crucible 3 and optionally also to change it. The position of the heating coil 12 that can be axially changed during the growth process is indicated in FIG. 1 by the double arrow 15. In particular, the heating coil 12 is displaced, adapted to the growth progress of the growing SiC volume monocrystal 2. The displacement preferably takes place downwardly, in other words in the direction of the SiC source material 6, and preferably by the same length by which the SiC volume monocrystal 2 grows, for example in total by about 20 mm. For this purpose, the growth arrangement 1 contains correspondingly configured checking, control and adjustment devices, not shown in more detail.

The SiC growth gas phase 9 in the crystal growth region 5 is fed by the SiC source material 6. The SiC growth gas phase 9 contains at least gas constituents in the form of Si, $Si_2C$ and $SiC_2$ (=SiC gas species). The transport of the SiC source material 6 to a growth boundary surface 16 at the growing SiC volume monocrystal 2 takes place along an axial temperature gradient. An axial temperature gradient measured in the direction of the center longitudinal axis 14 of at least 5 K/cm, preferably of at least 10 K/cm, is adjusted, in particular, at the growth boundary surface 16. The temperature within the growth crucible 3 decreases toward the growing SiC volume monocrystal 2. This can be achieved by various measures. Thus, an axially varying heating can be provided by a division, not shown in more detail, of the heating coil 12 into two or more axial part portions. Furthermore, a stronger heating effect can be adjusted in the lower portion of the growth crucible 3, for example by a corresponding axial positioning of the heating coil 12, than in the upper portion of the growth crucible 3. Moreover, the heat insulation at the two axial crucible end walls may be different. As indicated schematically in FIG. 1, the thermal insulation layer 10 at the lower crucible end wall may, for this purpose, have a larger thickness than at the upper crucible end wall. Furthermore, it is possible for the thermal insulation layer 10 adjacent to the upper crucible end wall 7, to have a central cooling opening 17, through which heat is dissipated and which is arranged about the central longitudinal axis 14. The central cooling opening 17 is indicated in FIG. 1 by the dashed lines.

The SiC volume monocrystal 2 grows in a growth direction 18, which is oriented, in the embodiment shown in FIG. 1, from top to bottom, in other words from the crucible lid 7 to the SiC storage region 4. The growth direction 18 runs parallel to the central center longitudinal axis 14. As the growing SiC volume monocrystal 2 in the embodiment shown is arranged concentrically within the growth arrangement 1, the central center longitudinal axis 14 can also be allocated to the growth arrangement 1 as a whole.

Moreover, the SiC growth gas phase 9 also contains doping substances, which are not shown in more detail in the view according to FIG. 1, which are nitrogen ($N_2$) in the embodiment. Alternative or additional doping substances such as, in particular aluminum (Al), Vanadium (V) and/or boron (B) are also possible. The doping substance is supplied either in gaseous form or by the then accordingly pre-treated SiC source material 6. In the embodiment, the SiC volume monocrystal 2 has an n-doping with nitrogen. This is moreover 4H—SiC. However, another doping or another SiC polytype is also basically possible FIGS. 2 and 3 in each case show an enlarged detail of the growth arrangement 1 at a time before (FIG. 2) or during (FIG. 3) the heating phase arranged before the actual beginning of growth.

The SiC seed crystal 8, together with a seed holder 19, forms the holder-seed unit 20, which is loosely inserted in a recess 21 on the inside of the crucible side wall 13. The holder-seed unit 20 is formed by a rigid connection, which can preferably, however, be detached again, of the SiC seed crystal 8 to the seed holder 19. In particular, the SiC seed crystal 8 is glued to the seed holder 19. A holder diameter D1 of the seed holder 19 is greater than a seed diameter D2 of the SiC seed crystal 8, but smaller than a recess diameter D3 of the recess 21. The holder-seed unit 20 is placed with the edge region of the seed holder 19 projecting radially over the SiC seed crystal 8 on a recess side wall 22 of the recess 21. The growth boundary surface 16 of the SiC seed crystal 8, on which the SiC volume monocrystal 2 grows during the actual growth, is directed downwardly, into the crystal growth region 5 and toward the SiC storage region 4, not shown in FIGS. 2 and 3. The crystal growth region 5 has a growth region diameter D4, which is larger, in particular larger by about 10 mm, than the seed diameter D2 of the SiC seed crystal 8.

Located between a rear side of the seed holder 19 remote from the SiC seed crystal 8 and the upper crucible end wall 7 is a cavity 23, which extends into the region between a side limiting face of the seed holder 19 and the crucible side wall 13 within the recess 21. The cavity 23 is therefore located behind the holder-seed unit 20 and within the wall structure of the growth crucible 3. A second cavity 29 in the form of a free annular gap running tangentially around the SiC seed crystal 8 is also formed between a side peripheral edge of the SiC seed crystal 8 and the inside of the crucible side wall 13. The cavity 29 is open toward the crystal growth region 5.

In the embodiment shown, the seed holder 19 has a holder thickness T1 of about 1 mm, the SiC seed crystal 8 has a seed thickness T2 of about 0.7 mm and the cavity 23 has a cavity thickness T3 of about 300 μm. The seed holder 19 consists of graphite material with a coefficient of heat expansion of about $5 \cdot 10^{-6} K^{-1}$. The coefficient of heat expansion of the seed holder 19 is therefore larger than that of the SiC seed crystal 8 consisting of monocrystalline SiC material.

Figure 2:
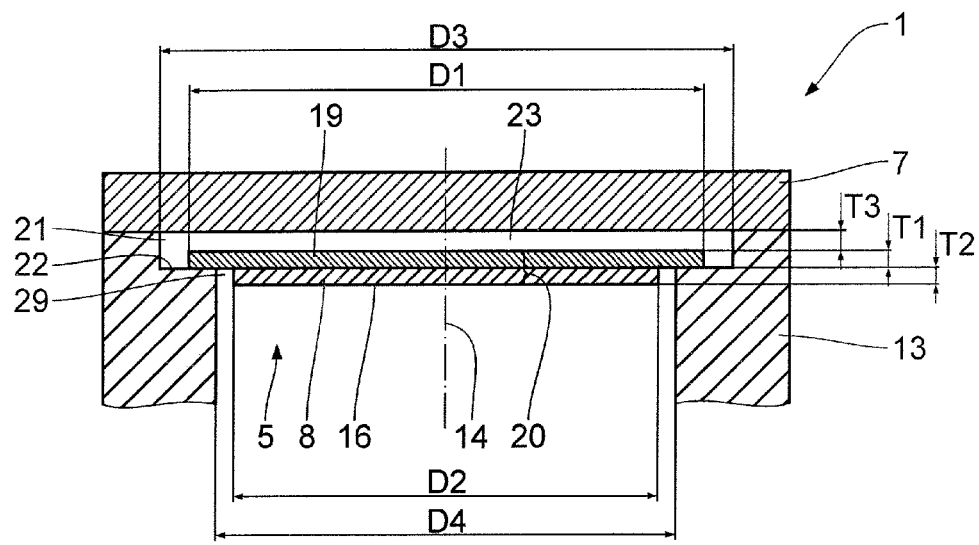
FIG. 2 is a diagrammatic sectional view of an enlarged detail of the growth arrangement according to FIG. 1 before a heating phase arranged before the actual beginning of growth, with the holder-seed unit inserted in the growth crucible.
Figure 3:
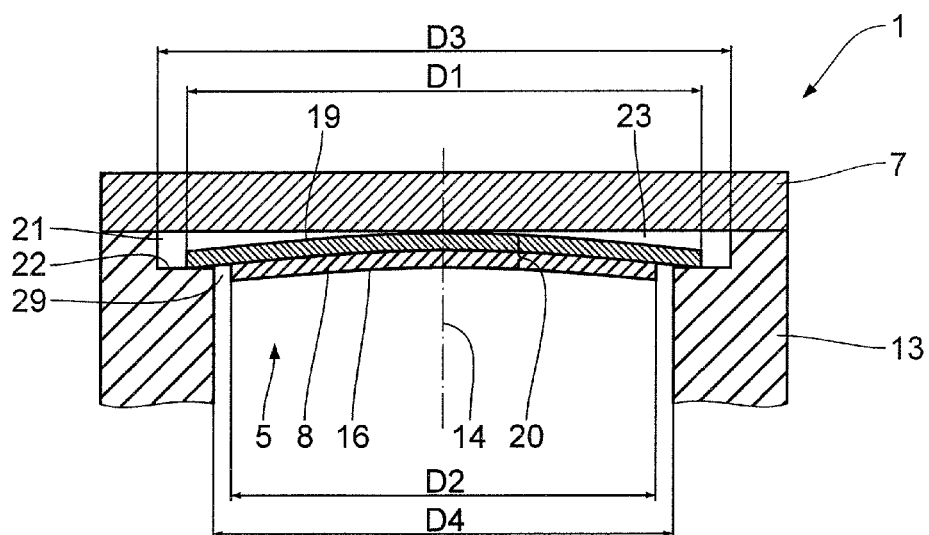
FIG. 3 is a diagrammatic sectional view of an enlarged detail according to FIG. 2 with bending of the holder-seed unit during the heating phase before the actual beginning of growth.

The conditions before the beginning of the heating phase are shown in FIG. 2. The SiC seed crystal 8 and the seed holder 19 are located in their respective disc-like level starting state. The SiC seed crystal 8 has an SiC crystal structure with lattice planes, which extend homogeneously or in a level manner in the starting state according to FIG. 2. In particular, the lattice planes have substantially the same orientation in the center around the center longitudinal axis 14 as in the edge region of the SiC seed crystal 8 adjoining the side peripheral edge.

During the heating phase, the growth arrangement 1 is heated from room temperature to the operating temperature of over 2000° C. required for the sublimation growth. In this case, because of the different coefficients of heat expansion of the SiC seed crystal 8 and the seed holder 19, the bending or curvature of the holder-seed unit 20 shown in FIG. 3 occurs. The bending extends into the cavity 23 provided for this. Its free space and also the free space which is formed because of the spacings between the side peripheral edges of the SiC seed crystal 8 and the seed holder 19, on the one hand, and the crucible side wall 13, on the other hand, allow and encourage the formation of the bend. The special ratio of holder thickness T1 to seed thickness T2, which has a value of about 1.43 in the embodiment, has the same favorable effect.

Because of the mechanical bending of the SiC seed crystal 8, changes also occur within the SiC crystal structure. The lattice planes no longer run in a level manner within the SiC seed crystal 8. Thus, the lattice plane orientation in the edge region differs from the lattice plane orientation in the center, in particular with an amount of angle difference of about 0.075° to 0.1°. This non-homogeneous lattice plane course is then also passed down into the SiC volume monocrystal 2, which, on conclusion of the heating phase, grows during the actual sublimation growth process on the SiC seed crystal 8.

Figure 4:
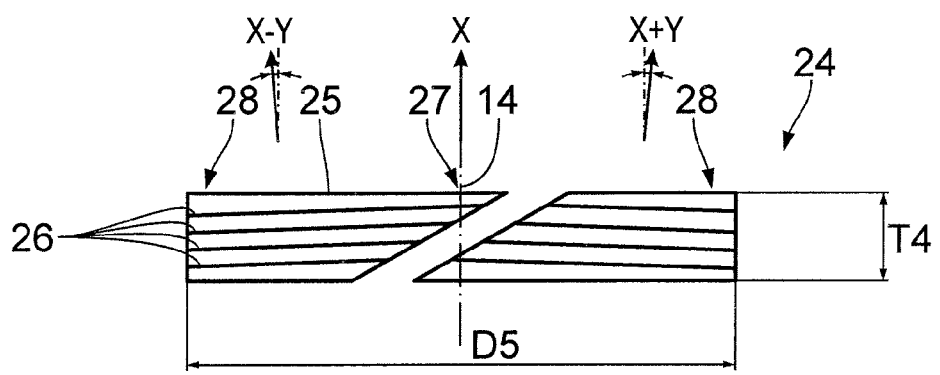
FIG. 4 is a diagrammatic cross-sectional view of an embodiment of a monocrystalline SiC substrate, which is produced from an SiC volume monocrystal grown by the growth arrangement according to FIGS. 1 to 3, with bent lattice planes.
Figure 5:
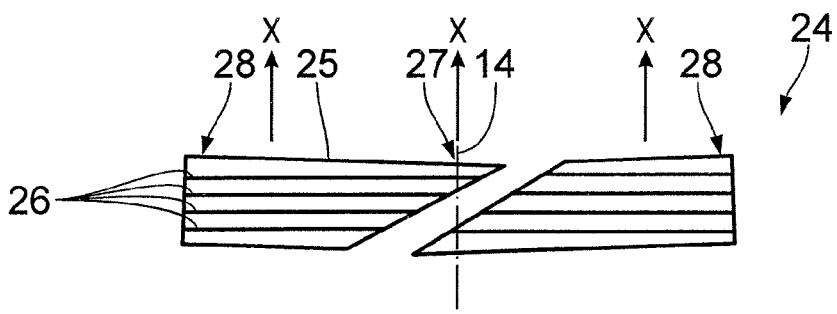
FIG. 5 is a diagrammatic cross-sectional view of the SiC substrate according to FIG. 4 after the heating phase before an epitaxy process.

The SiC volume monocrystal 2, in its SiC crystal structure, substantially has the same non-homogeneous lattice plane course as the SiC seed crystal 8 bent during the heating phase. The same applies to the disc-like SiC substrates 24, which are produced from the SiC volume monocrystal 2. All monocrystalline SiC substrates 24 of this type, of which one embodiment is shown in a cross sectional view in FIGS. 4 and 5, are obtained from the SiC volume monocrystal 2 in that they are cut off or sawn off axially successively as discs perpendicular to the growth direction 18 or to the center longitudinal axis 14. The SiC substrate 24 is large and thin. In the embodiment, its substrate main surface 25 has a substrate diameter D5 of 150 mm, whereas a substrate thickness T4 is about 500 μm.

Lattice planes 26 of the SiC crystal structure are also entered schematically in the view shown in FIG. 4 of the SiC substrate 24. In the state shown in FIG. 4, the SiC substrate 24 has front and rear faces that are practically ideally level and arranged practically ideally parallel to one another, of which one is the substrate main surface 25. The lattice planes 26 have the already described non-homogeneous course, in which the lattice plane orientations in the center 27 close to the center longitudinal axis 14 deviate from those in the edge region 28, in particular in turn by up to 0.1° in terms of amount. In the center 27, the lattice planes 26 have an orientation with a central angle of inclination relative to the direction of the center longitudinal axis 14, the angle of inclination being determined between the local surface normal of the lattice plane 26 and the direction of the center longitudinal axis 14. In the embodiment shown, the central angle of inclination is approximately zero. The lattice planes 26, in the center 27 run practically perpendicular to the center longitudinal axis 14. This is not the case in the edge region 28. There, the lattice planes 26 have a peripheral angle of inclination that differs from zero relative to the direction of the center longitudinal axis 14. The amount of the peripheral angles of inclination, which are symbolized in FIG. 4 by ±Y, is up to 0.1°. The tilting of the substrate main surface 25 relative to one of the main planes or main directions of the SiC crystal lattice is designated X in FIG. 4. In the embodiment shown in FIG. 4, X gives the deviation from the c-axis [0001] of the SiC crystal lattice. The tilting X can, in particular, adopt values between 0° and 10°, preferably between 0° and 5°. A value of 4° is typical.

In FIG. 5, the SiC substrate 24 is shown after the heating phase before an epitaxy process, which is carried out during further use of the SiC substrate 24 to produce a semiconductor component. A mechanical bending caused by heat again occurs, but now of the SiC substrate 24, as a result of which the lattice planes 26 are virtually "bent back". The changes in the lattice plane course caused by the bending during the heating phase before the epitaxy process specifically compensate approximately the non-homogeneities in the lattice plane course deliberately introduced beforehand into the SiC substrate 24, so that the lattice planes are then practically ideally level and form a virtually perfect starting basis for the monocrystalline SiC epitaxy layer to be applied. To this extent, the SiC substrate 24 is very suitable for producing components.

The invention claimed is:

1. A method for producing an SiC volume monocrystal by means of sublimation growth, which comprises the steps of:
    disposing an SiC seed crystal in a crystal growth region of a growth crucible before a beginning of growth;
    introducing a powdery SiC source material into an SiC storage region of the growth crucible;
    producing a SiC growth gas phase during a growth period by means of sublimation of the powdery SiC source material and by means of transport of sublimated gaseous components into the crystal growth region, the SiC volume monocrystal having a central center longitudinal axis grows by means of deposition from the SiC growth gas phase on the SiC seed crystal;
    bending the SiC seed crystal during a heating phase before the beginning of the growth period such that an SiC crystal structure with a non-homogeneous course of lattice planes is adjusted in the SiC seed crystal, the lattice planes at each point have an angle of inclination relative to a direction of the center longitudinal axis, and peripheral angles of inclination at a radial edge of the SiC seed crystal differ in terms of amount by at least 0.05° and by at most 0.2° from a central angle of inclination at a site of the central center longitudinal axis; and
    propagating the SiC crystal structure, of the SiC seed crystal, with the non-homogeneous course of the lattice planes during growth from the SiC seed crystal into the growing SiC volume monocrystal.

2. The method according to claim 1, which further comprises:
    rigidly connecting the SiC seed crystal, before the beginning of the growth process, to a seed holder to form a holder-seed unit, the holder-seed unit being loosely inserted with a downwardly directed growth boundary surface of the SiC seed crystal in a region of an upper crucible end wall of the growth crucible into the growth crucible, and a cavity located within a wall structure of the growth crucible being formed between a rear side of the seed holder remote from the SiC seed crystal and the upper crucible end wall;
    setting an axial holder dimension of the seed holder with a value in a range between 0.5 mm and 1.5 mm; and
    using a holder material, which has a different coefficient of heat expansion to an SiC material of the SiC seed crystal, for the seed holder.

3. The method according to claim 2, which further comprises setting an axial cavity dimension of the cavity with a value in a range between 100 μm and 400 μm.

4. The method according to claim 1, which further comprises setting an axial seed dimension of the SiC seed crystal with a value in a range between 0.5 mm and 1.0 mm.

5. The method according to claim 2, which further comprises setting an axial holder dimension of the seed holder with a value, which is at most twice as large as an axial seed dimension of the SiC seed crystal.

6. The method according to claim 2, which further comprises:
    setting an axial holder dimension of the seed holder with a value in a range between 0.9 mm and 1.1 mm; and
    setting an axial seed dimension of the SiC seed crystal with a value in a range between 0.65 mm and 0.75 mm.

7. The method according to claim 2, wherein a radial extent into a region between a side limiting face of the seed holder and a crucible side wall is provided for the cavity.

8. The method according to claim 1, which further comprises setting a growth region diameter of the crystal growth region to be larger than a seed diameter of the SiC seed crystal.

9. The method according to claim 1, which further comprises setting a growth region diameter of the crystal growth region to be larger by at most 20 mm than a seed diameter of the SiC seed crystal.

10. The method according to claim 8, wherein the growth region diameter (D4) is provided in a region, in which the SiC seed crystal is located.

11. The method according to claim 2, which further comprises forming the seed holder from a holder material with a value of a coefficient of heat expansion in a range between $4 \cdot 10^{-6}$ K$^{-1}$ and $6 \cdot 10^{-6}$ K$^{-1}$.

12. The method according to claim 2, which further comprises forming the seed holder from a holder material with a value of a coefficient of heat expansion of about $5 \cdot 10^{-6}$ K$^{-1}$.

* * * * *